United States Patent [19]

Davies et al.

[11] 4,447,276
[45] May 8, 1984

[54] MOLECULAR BEAM EPITAXY ELECTROLYTIC DOPANT SOURCE

[75] Inventors: Graham J. Davies, Woodbridge; Roger Heckingbottom; David A. Andrews, both of Ipswich, all of England

[73] Assignee: The Post Office, London, England

[21] Appl. No.: 274,286

[22] Filed: Jun. 15, 1981

[51] Int. Cl.³ .......................................... H01L 21/203
[52] U.S. Cl. ........................... 148/175; 156/606; 156/610; 156/611; 204/247; 252/62.3 GA; 252/950; 252/951; 423/571; 427/85
[58] Field of Search ............... 148/174, 175; 427/85, 427/87; 156/606, 610, 611; 252/62.3 GA, 950, 951; 423/567 R, 567 A, 571; 429/191, 219; 204/59 R, 59 M, 59 AM, 60, 242, 243 R, 247

[56] References Cited

U.S. PATENT DOCUMENTS 3,839,084 10/1974 Cho et al. ................ 148/175 X
4,218,271 8/1980 Wood ................................ 148/175
4,330,360 5/1982 Kubiak et al. ........................ 427/86

OTHER PUBLICATIONS

Rickert, H., "Electrochem. Knudsen Cells ... Vapours", Physics of Electrolytes (Text), vol. 2, 1972, (Academic Press), pp. 519–538.

Primary Examiner—W. G. Saba
Attorney, Agent, or Firm—Cushman, Darby & Cushman

[57] ABSTRACT

A method of growing crystalline semiconductors such as GaAs is disclosed. The method involves epitaxial deposition from the vapor phase and provides dopant material such as sulphur in the form of a molecular beam. The molecular beam is developed by effusion from a knudsen cell. The difficulties previously encountered using sulphur as such a cell are counteracted by use of an electrochemical cell as the sulphur source. The technique allows complicated doping profiles to be produced.

3 Claims, 6 Drawing Figures

MOLECULAR BEAM EPITAXY ELECTROLYTIC DOPANT SOURCE

DESCRIPTION

This invention relates to a method of epitaxial growth of material from the vapour phase.

One method for growing materials by epitaxial deposition, particularly for growing crystalline semi-conductors, uses a molecular beam. In this method a very low pressure beam of molecules of the material to be deposited is emitted on to a substrate from an effusion cell. The effusion cell commonly known as a Knudsen cell comprises a chamber with an accurately dimensioned orifice and means for heating the chamber during evacuation to ultrahigh vacuums. The chamber houses the substance whose vapour is required to effuse through the orifice and effusion occurs when the orifice has a diameter less than the mean free path of the molecules of vapour from the substance in the cell.

Molecular beam epitaxy is a process commonly used for growing semiconductors formed from group III and V elements e.g. Gallium Arsenide; and involves deposition on to a heated GaAs substrate. It is often required to incorporate dopants into the semiconductor material, the dopant also being provided as a molecular beam. Hitherto, the incorporation of donor impurities in such semiconductors as GaAs by molecular beam epitaxy has been mainly confined to dopants from the group IV elements Sn, Ge, and Si. The usual dopants for creating n-type material, the group VI elements S, Se and Te, have proved difficult to use in this process. One technique that has been proposed for incorporating these group VI dopants in a molecular beam epitaxial growth process is described in U.K. patent application No. 2,030,551 where these group VI elements are used in the form of the chalcogenides, PbS and PbSe in the effusion cell. Other attempts have used SnTe as a starting material at temperatures in excess of 580° C. but surface segregation of the tellurium in the grown material was found to occur.

There has been a general reluctance to seriously consider using the group VI elements as dopants to obtain n-type GaAs in a molecular beam epitaxy process despite the aforementioned attempts. One cause of this reluctance is a belief that such high vapour pressure elements are totally unsuitable for incorporation at usable levels in the low pressure regime of molecular beam epitaxy. There is some evidence, however, that this belief is unfounded. Secondly there is a practical problem in that in a Knudsen cell a thermal source of, for example, elemental sulphur cannot be conveniently installed in a system that is to be baked-out after assembly.

The present invention has as one object the provision of a method for enabling elements such as sulphur to be included as dopants in III-V semiconductors and particularly GaAs prepared by molecular beam epitaxy in a controlled manner, and in so doing have invented a technique with wider applications and which provides such a measure of control of dopant concentration that it may be used with advantage to construct devices even when the deposited material is not naturally as difficult to produce in an effusion cell as those group VI materials considered above.

The present invention provides a method of growing solid material from the vapour phase by epitaxial deposition on a substrate using a molecular beam formed from material in an effusion cell, including the step of producing at least one component of the molecular beam in an electrochemical cell within the effusion cell and controlling the amount of said component produced by applying an emf to the electrochemical cell.

The component of the molecular beam that is produced in the electrochemical cell may be a dopant for the bulk deposited material.

The dopant material may be one of either sulphur, selenium, or tellurium and the electrochemical cell may then comprise successively adjacent regions of $Ag_2X$, AgI and Ag, where X is S, Se, or Te.

Embodiments of the invention will now be described, by way of example only, with reference to the accompanying drawings. In the drawings.

A process for growing a sulphur-doped n-type GaAs crystal is carried out in a molecular beam epitaxy apparatus such as that made by Vacuum Generators under No. MB288. This apparatus comprises three stainless steel vacuum chambers; one of which is where the GaAs crystal is grown, the second is where the sample is prepared and the third is a chamber for permitting fast entry. The sample preparation chamber and the crystal growing chamber are both pumped separately by respective diffusion pumps, each supported by liquid $N_2$ titanium sublimation pumps. The sample preparation chamber is evacuated to a base pressure of $\leq 3 \times 10^{-10}$ torr and the crystal growing chamber is evacuated to a base pressure $\leq 1 \times 10^{-10}$ torr. When the cells are operational the pressure out of the beams is $<2 \times 10^{-9}$ torr. An analysis of the beam contents can be carried out by Auger electron spectroscopy in the preparation chamber while the growth of the crystal can be monitored by a 15 Kev reflection electron defraction system in the crystal growing chamber.

The substrate on which the GaAs crystal is grown comprises polished (100)-oriented Cr or Sn-doped GaAs.

The surface of the substrate is prepared by free etching in a 7:1:1 $H_2SO_4:H_2O_2:H_2O$ solution; the substrate then being rinsed thoroughly in distilled water and blown dry in a stream of dry nitrogen. The substrate prepared in this way is quickly transferred to the sample preparation chamber and is heated to a temperature in the range 700 to 770° K. to desorb all $H_2O$, CO and $CO_2$ adsorbed when the samples were mounted. The preparation chamber is evacuated and when the pressure falls to less than $1 \times 10^{-9}$ torr the substrate is transferred to the crystal growing chamber where it is thermally cleaned in an $As_4$ flux at a temperature of approximately 870° K. the surface of the substrate is then stabilized with respect to arsenic.

Figure 1:
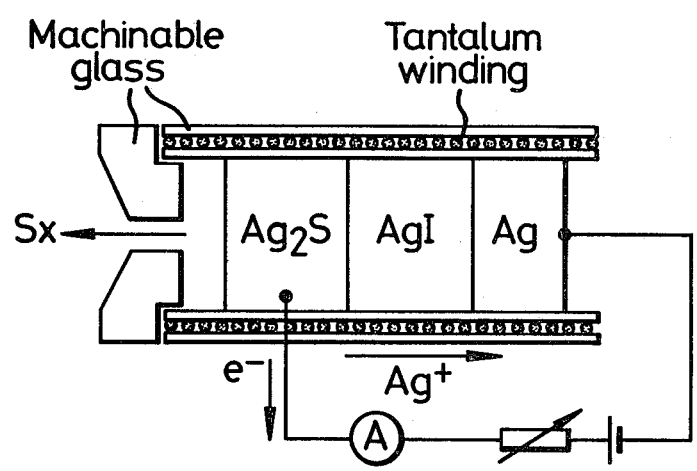
FIG. 1 is a schematic representation of a Knudsen cell incorporating an electrochemical cell.

In this embodiment of the invention the source of doped material in the Knudsen cell comprises a solid state electrochemical cell as shown in FIG. 1. This cell provides a source of molecular sulphur vapour and is controlled by an applied emf. The electrolyte material is encased within a double walled glass cylinder, between the walls of which is a tantalum heating winding. The electrolyte is prepared by compressing discs of its component materials in, for example, a conventional infrared sample preparation die. Alternatively these discs may be fused into a complete cylinder. The electrochemical cell comprises a platinum layer at each end, and in succession, a layer of silver, a layer of silver iodide, and a layer of silver sulphide. The positive terminal of the battery is connected to the Ag$_2$S layer. This cell produces elemental sulphur and can be heated to 350° C. without destruction. It therefore can be used in ultra high vacuum techniques. A machinable glass stopper is fixed in the end of the cylinder where the Ag$_2$S layer is located and has an orifice through which the molecular sulphur can effuse.

Silver sulphide co-existing with metalic silver at 200° C. contains a silver excess of $2\times10^{-3}$ g-atom Ag/mol Ag$_2$S, whereas silver sulphide co-existing with liquid sulphur at 200° C. has a very nearly ideal stoichiometry. The electrochemical cell is operated within this range of non-stiochiometry and its controlled operation is based on the fact that the chemical potentials and therefore the activities of both the silver and sulphur atoms in the silver sulphide vary with stoichiometry. Therefore, when the emf across the cell is changed, the chemical potential and the activity of the sulphur in the silver sulphide is changed and hence the equilibrium gas phase pressure of sulphur over the cell is changed also.

The stiochiometry of the silver sulphide in the cell may be changed by external control by controlling the cell potential so that a current passes through the cell. The silver iodide is an almost pure ionic conductor and acts as a source or sink of silver ions by transporting them between the silver and the silver sulphide in the cell.

Whenever an emf is applied to the cell from the battery an electric current will flow through the cell as silver ions are added to or removed from the silver sulphide in the cell until the stiochiometry has reached the point where the natural emf of the cell is equal to the applied emf. When this stage is reached no ionic current will flow and the equilibrium vapour pressure above the silver sulphide is constant.

Since the electrochemical cell is in a Knudsen cell with an orifice the sulphur vapour will escape; an ionic current will flow through this cell removing silver from the silver sulphide and maintaining the nonstoichiometry against the lost sulphur. This current through the cell is then a direct measure of sulphur flux effusing from the Knudsen cell.

The principal properties of the electrochemical cell are related by the equation:

$$P_{S_x} = P^{\circ}_{S_x} \exp\left[\frac{2x(E - E^*)F}{RT}\right]$$

where $P_{S_x}$ is the equilibrium partial pressure of sulphur molecules $S_x$ over Ag$_2$S, $P^{\circ}_{S_x}$ is the equilibrium partial pressure of sulphur molecules $S_x$ over liquid sulphur, E is the emf of the cell E* is the emf of the cell in equilibrium with liquid sulphur, R is the Gas constant, T is absolute temperature, F is Faraday's constant.

E* has been measured as 230 mV at 200° C. and 243 mV at 300° C. [N. Rickert, Physics of Electrolytes Vol. 2 Ed. J. Hladik, p519 Academic Press (1972)]. $P^{\circ}_{S_x}$ has been tabulated in the same reference.

The effusion from a Knudsen cell is given by:

$$J = 1.118 \times 10^{22} \frac{PA}{l^2\sqrt{MT}}$$

where

J is the flux (particles cm$^{-2}$s$^{-1}$),

P is the source pressure (mmHg),

A is the orifice area, and l is the orifice to substrate distance.

Figure 2:
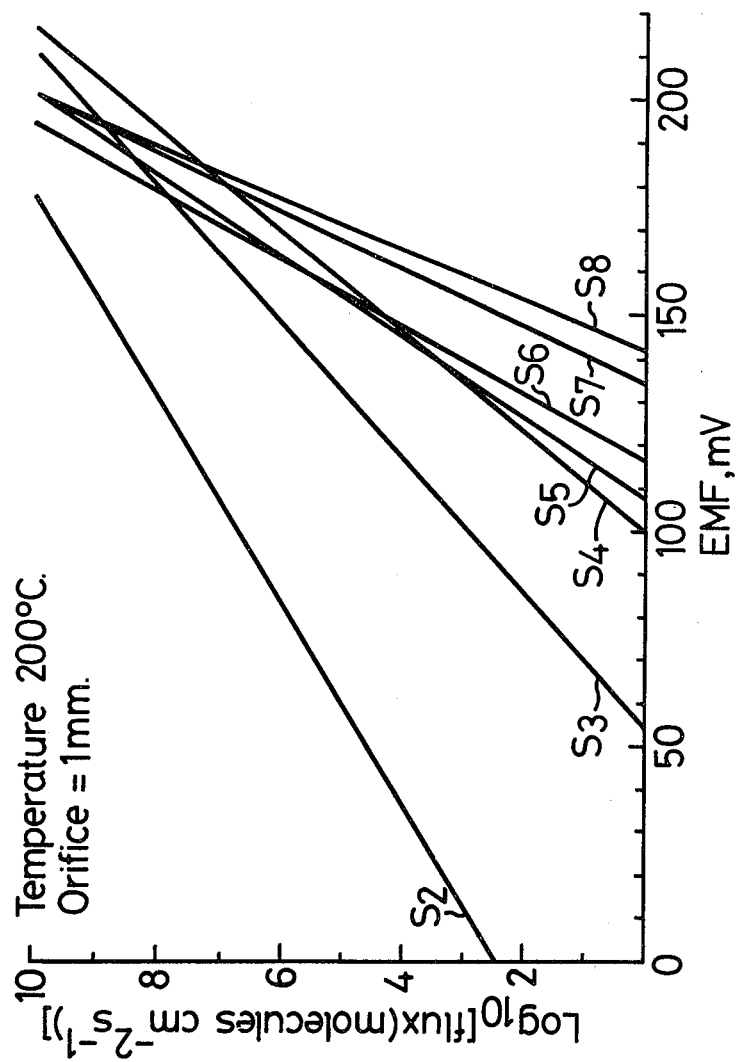
FIG. 2 is a graph of the flux of a number of species of sulphur effused from a cell plotted against the emf applied to the electrochemical cell.
Figure 3:
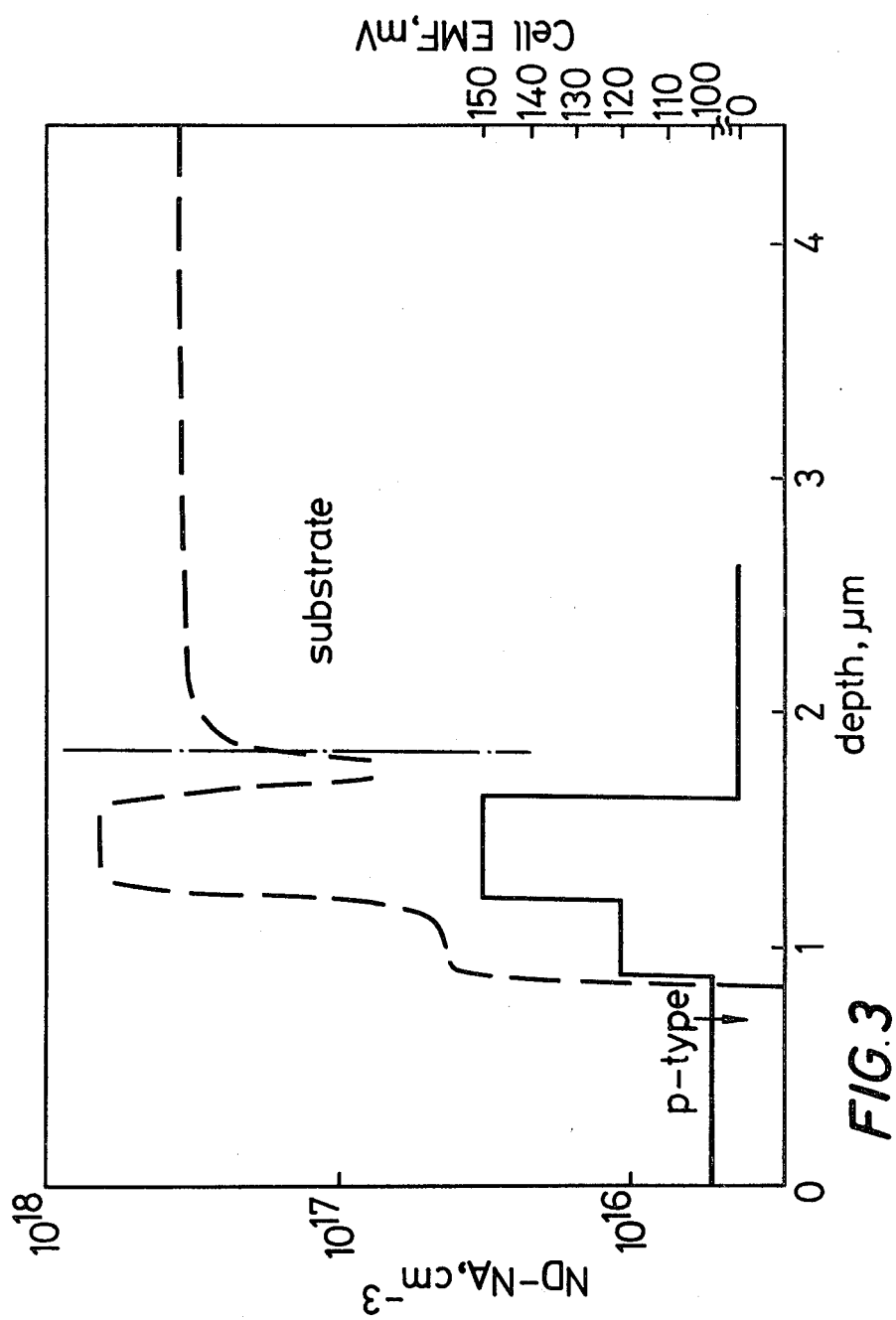
FIG. 3 is a graph showing as a broken line the variation of the net donor concentration in deposited material against the depth into the material, the applied emf is also plotted as a solid line.

The flux of molecules $S_x$ effusing from the Knudsen cell may be calculated from the above equations. FIG. 2 shows this flux plotted against the applied emf calculated for a particular sized cell. It will be noted that whereas the vapour above the liquid sulphur regions is predominatly $S_8$, that above the silver sulphide, when it is sufficiently away from stiochiometry (i.e. E<E*) is predominantly $S_2$. The other species $S_3$, $S_4$, $S_5$ . . . $S_7$ may be generated in predetermined proportions by varying the operating conditions in the cell. In all the experiments carried out by the inventors with sulphur dopant being produced from this electrochemical cell, the $S_2$ flux has been at least 3 orders of magnitude larger than the other species evolved. In an example, the data illustrated on the graph in FIG. 2 were used to select cell emfs corresponding to a useful working range of carrier concentrations. The electrochemical cell was programmed for a three-step profile of diminishing carrier concentration by stepping the cell emf appropriately. FIG. 3 shows the resultant net carrier profile against the predicted profile and these vary by a factor of approximately 3. The third step in the profile which was predicted to have a net donor concentration, $N_D-N_A \simeq 10^{15}$cm$^{-3}$ reverted to the level of low, nominally undoped, material which is that usually obtained in the MBE deposition of gallium arsenide with a net acceptor concentration $N_A-N_D \simeq 10^{15}$cm$^{-3}$.

The carrier concentration profile shown as a broken line in FIG. 3 indicates that the carrier density responds very quickly to the change in the cell emf. Theoretically, the factors that might be expected to contribute to this response time include polarisation and diffusion effects in the electrolyte itself and diffusion/condensation in the Knudsen cell. It has been shown that polarisation effects have time constants of less than 1 second. Similarly, diffusion effects e.g. delay in the changes in stoichiometry induced by the applied emf at 200° C. have been shown to be eliminated in less than 1 second. From the dimensions of the Knudsen cell used in this example, it is calculated that diffusion alone could be sufficient to empty a cell, given a high doping flux (equivalent to a net donor concentration of approximately $10^{18}$cm$^{-3}$), in less than a second. It can be concluded that devices may be constructed using this method in which doping level changes can be obtained with sharper interfaces than has previously been possible with a single conventional thermal source.

Figure 4:
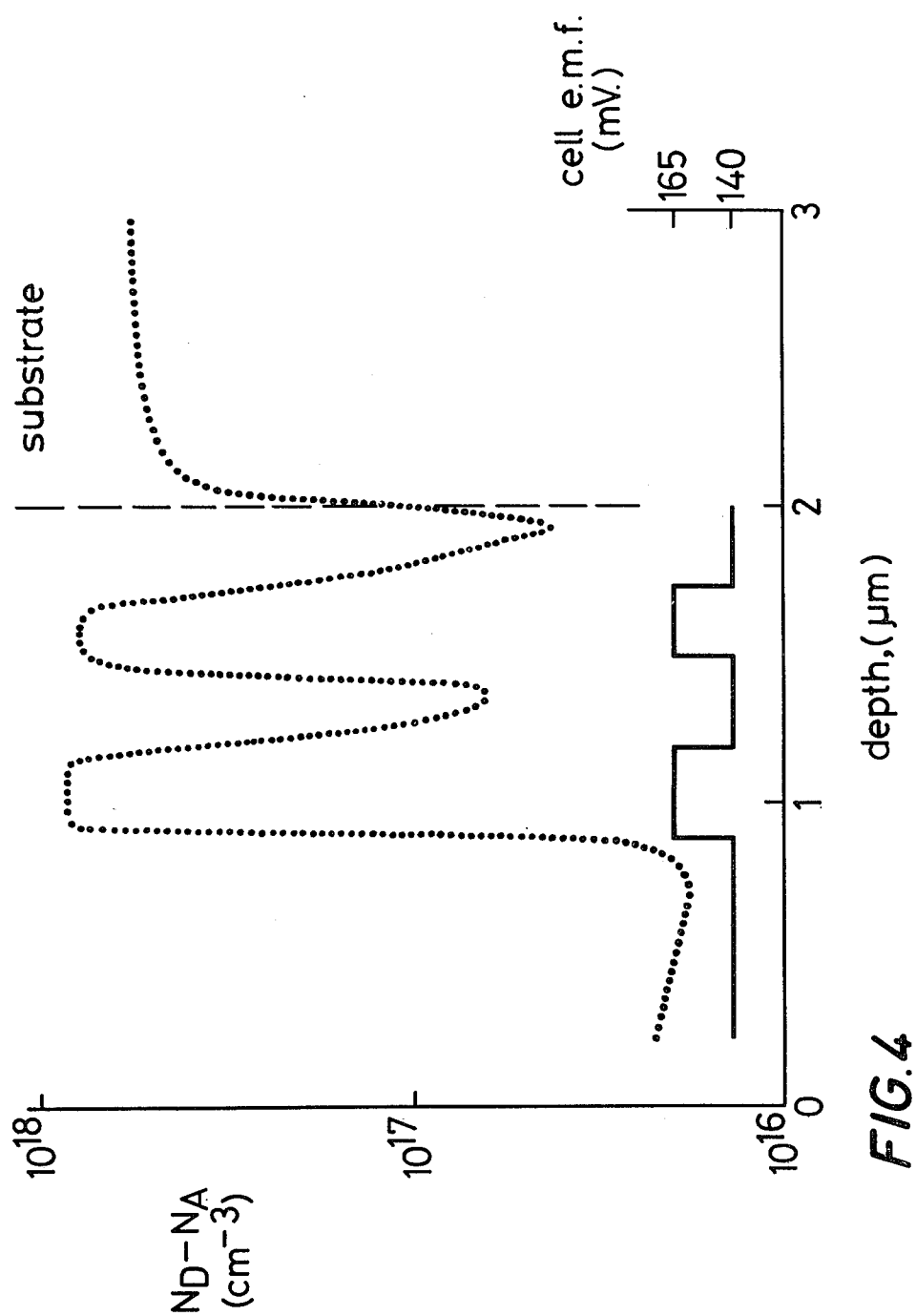
FIG. 4 is a graph similar to that of FIG. 3 but with a different form of applied emf.

FIG. 4 shows a further example in which the applied emf was switched successively between high and low states. The interface between low carrier concentration and high carrier concentration near the surface of the deposited gallium arsenide represents a change through two orders of magnitude i.e. $N_D-N_A$ changes from approximately $10^{16}$ cm$^{-3}$ to approximately $10^{18}$ cm$^{-3}$ and the change is estimated to take place over a distance $\leq 400$ Å.

The ultimate resolution of the C-V profiling is limited by the Debye length which in the case of gallium arsenide and the carrier concentration of $10^{16}$ cm$^{-3}$ is about 400 Å. The C-V profiling technique employed in this example is known as the "Post Office Plotter" and is described for example by T. Ambridge et al, J. Electrochem. Soc, 127 (1) p222 (1980). In essence this profiling technique involves the use of a liquid electrolyte both to act as a Schottky barrier and to dissolve the investigated layer in a highly controlled manner. This combination allows continuous profiling to virtually any required depth without recourse to the removal of the sample for step-etching prior to each electrical measurement. The dissolution of the layer is activated by hole-electron pairs generated by strongly absorbed, short wave illumination. Uniformity of illumination is essential for accurate depth resolution, and in practice some loss of definition is therefore to be expected as the depth is increased, as may be apparent in close spaced periodic structures such as that of this example and as shown in FIG. 4. The first measured interface i.e. the one nearest the surface is least likely to be effected and therefore is the most reliable as a measurement of carrier response.

Figure 5:
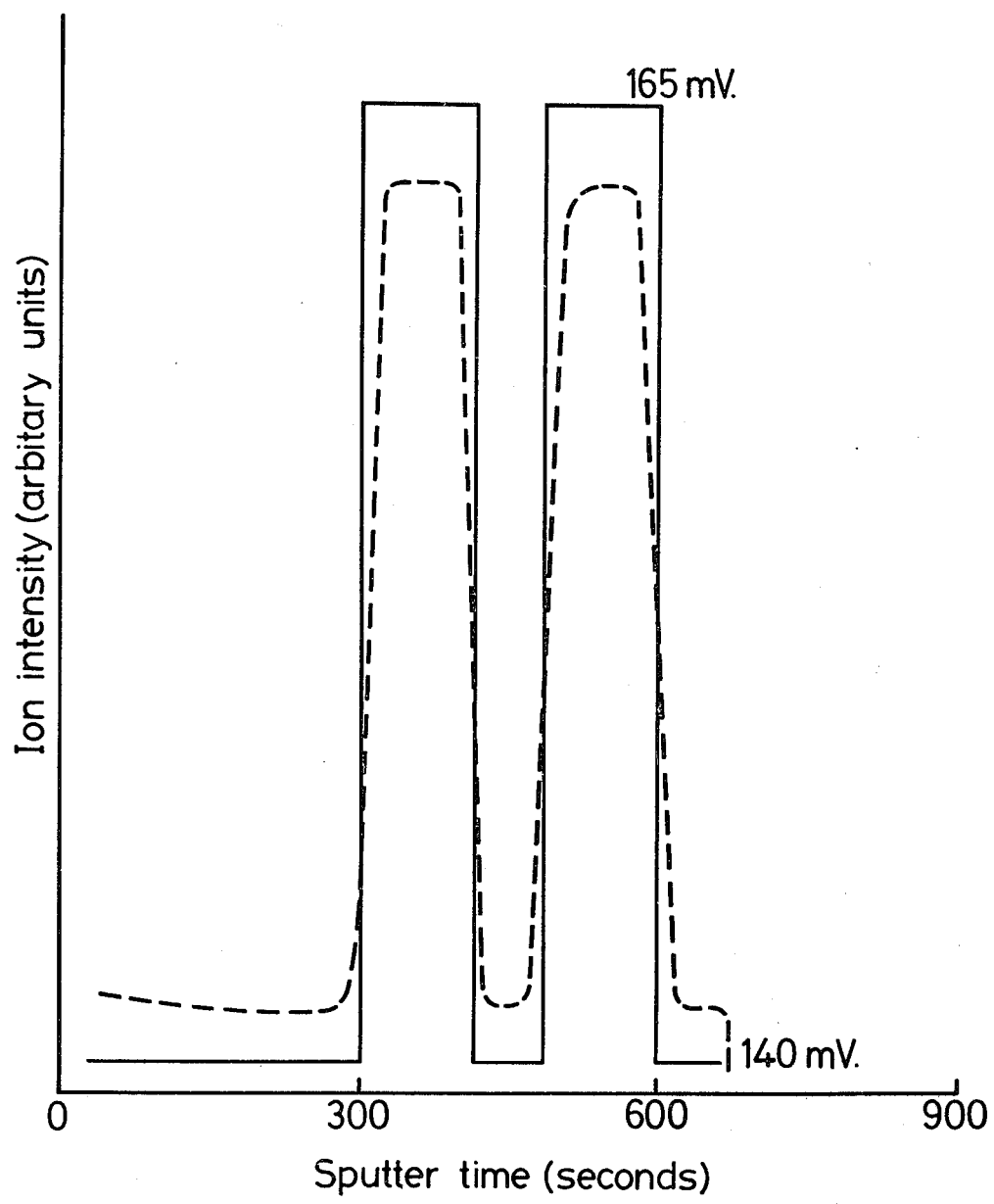
FIG. 5 is a graph illustrating the results of Secondary Ion Mass Spectrometry analysis of the material grown with a doping profile as illustrated by FIG. 4.

An independent check is usefully provided by secondary ion mass spectrometry (SIMS) analysis carried out on the same layer of the grown material. This chemical analysis for sulphur is shown in FIG. 5 and conclusively shows that the maxima in carrier concentration have the same sulphur concentrations whilst the minima are also self-consistent.

From these examples and analysis it can be reliably concluded that the doping level is so accurately dependent on the emf applied to the electrochemical cell that the electrochemical Knudsen cell should be capable of producing complicated doping profiles from relatively simple programming equipment such as a function generator.

Figure 6:
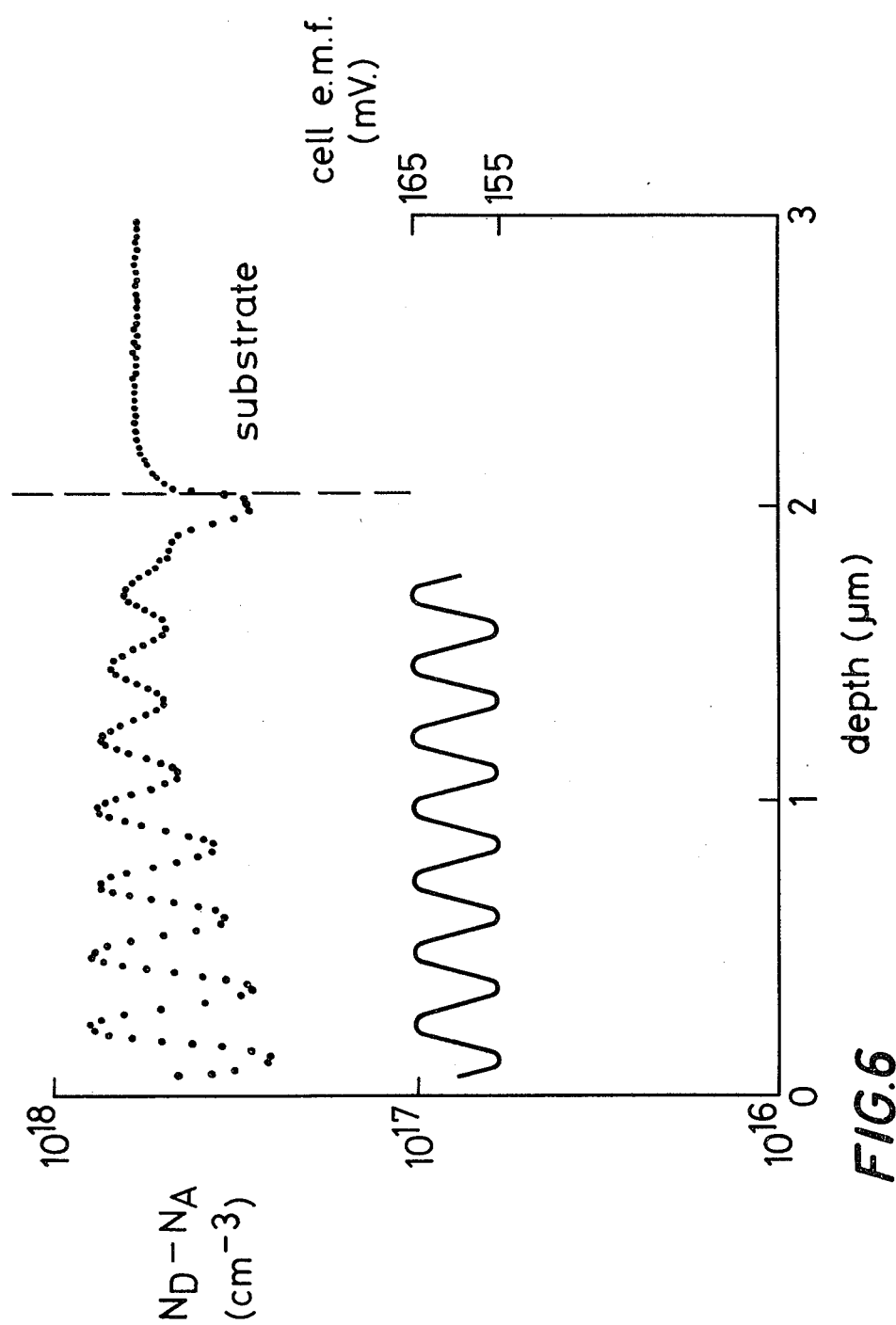
FIG. 6 is a graph similar to that of FIG. 3 but illustrating the results of a sinusoidally varying applied emf.

In a further example a simple sine wave function generator was applied to the electrochemical cell to give a sinusoidally varying applied emf. The maxima and minima of the sine wave emf were adjusted to produce the extreme limits of the carrier density required and the frequency of oscillation was chosen to complement the growth rate so that the distance between maxima and minima was approximately 0.1 μm. FIG. 6 shows the resultant doping profile and it will be noted that the applied and generated sine wave shapes match exactly in the position of maxima and minima. The damping of the C-V profile sine wave is again thought to be due to non-uniformity of the light source used in this measurement. This continuously varying carrier density profile is extremely difficult to achieve with the conventional Knudsen sources because of the large time constants inherent in the thermal lag of the cell.

In the various examples described above, the epitaxially grown surface was monitored by Nomarski interference microscopy to monitor morphological defects. Reflection electron defraction and Auger electron spectroscopy were also applied and these show the expected C (2×4) reconstruction normally associated with gallium arsenide growth under arsenic rich conditions. Undoped and doped layers ($N_D-N_A<10^{18}$ cm$^{-3}$) showed very smooth, flat surfaces when viewed under Nomarski conditions. Hitherto the most frequently used dopant in gallium arsenide crystals is tin and, as has been said, this suffers from surface segregation of the doping impurity from the bulk to the growing surface. This segregation has been observable by Auger electron spectroscopy at bulk incorporation rates greater than $1\times10^{18}$ cm$^{-3}$. In the example given above, sulphur surface segregation could not be detected by AES in any of the controlled layer growths even when the bulk doping levels was high as $3\times10^{18}$ cm$^{-3}$. Subsequent SIMS analysis has also confirmed this and showed that the chemical sulphur profile in a layer did not rise or dip at the surface or interface in contrast to the behaviour that has been reported for tin doping by other methods.

We claim:

1. A method of growing solid semiconductor material composed of group III and V elements from the vapor phase by epitaxial deposition on a substrate using one or more molecular beams formed from material in an effusion cell, including the step of:

producing a beam of dopant material for said semiconductor material in an electrochemical cell within the effusion cell by applying a controlled emf to said electrochemical cell, wherein the dopant material is one of either sulphur, selenium or tellurium, and said electro-chemical cell comprises successively adjacent regions of Ag$_2$X, Ag I and Ag, where X is S, Se or Te respectively.

2. The method claimed in claim 1 wherein the semiconductor is gallium arsenide.

3. The method claimed in claim 1 wherein said emf applied to the electrochemical cell is varied during the deposition period to provide the grown material with varying concentrations of the dopant through its depth.

* * * * *